United States Patent
Suh et al.

(10) Patent No.: US 7,507,990 B2
(45) Date of Patent: Mar. 24, 2009

(54) ORGANIC THIN FILM TRANSISTOR HAVING CIRCULAR ORGANIC SEMICONDUCTOR LAYER AND FLAT PANEL DISPLAY INCLUDING THE SAME

(75) Inventors: Min-Chul Suh, Suwon-si (KR); Jae-Bon Koo, Suwon-si (KR)

(73) Assignee: Samsung SDI Co., Ltd. (KR)

(*) Notice: Subject to any disclaimer, the term of this patent is extended or adjusted under 35 U.S.C. 154(b) by 392 days.

(21) Appl. No.: 11/281,951

(22) Filed: Nov. 16, 2005

(65) Prior Publication Data

US 2006/0102897 A1 May 18, 2006

(30) Foreign Application Priority Data

Nov. 18, 2004 (KR) .................. 10-2004-0094418

(51) Int. Cl.
*H01L 29/08* (2006.01)
*H01L 35/24* (2006.01)
*H01L 51/00* (2006.01)

(52) U.S. Cl. ................... 257/40; 257/E51.002
(58) Field of Classification Search ............ 257/40, 257/E51.002; 349/42, 43
See application file for complete search history.

(56) References Cited

U.S. PATENT DOCUMENTS

| | | | |
|---|---|---|---|
| 5,003,356 A * | 3/1991 | Wakai et al. ............ | 257/390 |
| 6,897,482 B2 * | 5/2005 | Morita et al. ........... | 257/72 |
| 7,170,088 B2 * | 1/2007 | Koo et al. ............... | 257/40 |
| 2002/0187573 A1 * | 12/2002 | Kido ...................... | 438/30 |
| 2003/0136958 A1 * | 7/2003 | Ong et al. ............... | 257/40 |
| 2005/0056847 A1 * | 3/2005 | Nakamura et al. ...... | 257/72 |
| 2006/0086937 A1 * | 4/2006 | Fujii et al. .............. | 257/72 |

* cited by examiner

*Primary Examiner*—Jerome Jackson, Jr.
*Assistant Examiner*—Anthony Ho
(74) *Attorney, Agent, or Firm*—Knobbe, Martens, Olson & Bear, LLP

(57) ABSTRACT

An organic thin film transistor comprising an organic semiconductor layer that does not cause a coffee stain effect and can prevent an imperfect contact with source and drain electrodes, and a flat panel display apparatus comprising the organic thin film transistor are provided. The organic thin film transistor comprises a gate electrode; source and drain electrodes insulated from the gate electrode; and an organic semiconductor layer insulated from the gate electrode and contacts the source and drain electrodes, wherein the organic semiconductor layer has a circular shape when viewed through a substrate on which the organic thin film transistor is formed, and an edge portion of at least one of the source and drain electrodes contacting the organic semiconductor layer having a curved shape that is concave toward the organic semiconductor layer.

14 Claims, 5 Drawing Sheets

ORGANIC THIN FILM TRANSISTOR HAVING CIRCULAR ORGANIC SEMICONDUCTOR LAYER AND FLAT PANEL DISPLAY INCLUDING THE SAME

CROSS-REFERENCE TO RELATED PATENT APPLICATION

This application claims priority to Korean Patent Application No. 10-2004-0094418, filed on Nov. 18, 2004, in the Korean Intellectual Property Office, the disclosure of which is incorporated by reference herein in its entirety.

BACKGROUND

1. Field of the Invention

The present invention relates to an organic thin film transistor and a flat panel display apparatus comprising the organic thin film transistor, and, more particularly, to an organic thin film transistor wherein an organic semiconductor layer does not cause a coffee stain effect and does not have imperfect contact with source and drain electrodes and a flat panel display apparatus comprising the organic thin film transistor.

2. Discussion of Related Art

Since the development of polyacetylene, a conjugated organic polymer having semiconductor characteristics, organic transistors for functional electronic and optical devices have been widely and actively researched and developed due to the various advantages of such organic materials. For example, such organic materials can be synthesized using various methods and can be formed in an assortment of shapes such as fibers and films. In addition, such organic materials are flexible, conductive, and can be produced at low costs.

In a conventional silicon thin film transistor comprising a silicon semiconductor layer, high concentration impurity-doped source and drain regions are formed with a channel region therebetween in the semiconductor layer. A gate electrode, which is insulated from the semiconductor layer, is located in a region corresponding to the channel region. Source and drain electrodes are formed contacting the source and drain regions, respectively.

However, the manufacturing cost of the conventional silicon thin film transistor having the above-described structure is high, and the conventional silicon thin film transistor is easily broken by an external impact. In addition, since the silicon thin film transistor is fabricated at a high temperature of 300° C. or more, a plastic substrate cannot be used because it must be treated at low temperature.

In particular, thin film transistors are used as switching devices for controlling the operation of pixel electrodes and as driving devices for the pixels in flat panel display apparatuses such as a liquid crystal displays, electroluminescent display devices (ELD), etc. Recently, in order to satisfy demands for thin, small, flexible flat panel display apparatuses, usage of a substrate made of a plastic material, rather than conventional glass material, has often been attempted. However, the plastic substrate must be treated at a low temperature, not the high temperature described above. Therefore, it is very difficult to use the conventional silicon thin film transistor on plastic substrates.

However, these problems can be solved by using an organic layer as a semiconductor layer of a thin film transistor. Therefore, organic thin film transistors using an organic layer as their semiconductor layer have recently been widely studied.

However, in the organic thin film transistor, it is difficult to pattern the organic semiconductor layer. In addition, there is a problem with imperfect contact between the organic semiconductor layer and the source and/or drain electrodes.

When patterning the organic semiconductor layer of the organic thin film transistor, photolithography, which is a conventional patterning method, cannot be used. In particular, when the circuit comprises a plurality of organic thin film transistors, an organic semiconductor layer must be patterned so as to prevent cross talk between adjacent organic thin film transistors. However, when the organic semiconductor layer is patterned using conventional wet and/or dry etching processes that follow conventional patterning methods, the organic semiconductor layer is seriously damaged and cannot be used. Therefore, a method of forming an organic semiconductor layer using an inkjet printing method, which does not require an additional patterning process, has been suggested. According to this method, an organic semiconductor-forming material is dropped only in predetermined regions, thereby resulting in the pattern of the organic semiconductor layer without further processing. However, when the organic semiconductor layer is formed by such an inkjet printing method, it results in a "coffee stain effect."

FIGS. 1 and 2 depict a schematic plan and a cross-sectional view, respectively, of an organic semiconductor layer with a coffee stain effect.

Referring to FIGS. 1 and 2, when an organic semiconductor layer forming material is dropped onto, for example, a substrate 1, to form an organic semiconductor layer 2 using an inkjet printing method, the thicknesses of the edge and center portions of the organic semiconductor layer 2 vary with time. The variation in the thickness of the organic semiconductor layer is large when the organic semiconductor layer has a non-circular shape, for example, a rectangular shape, etc. Further, when using an inkjet printing method to form the organic semiconductor layer, it is relatively easier to form the organic semiconductor layer in a circular shape. Thus, it is desirable to form the organic semiconductor layer in a circular shape.

FIG. 3 is a schematic plan view of a conventional organic thin film transistor having a circular organic semiconductor layer. FIG. 4 is a cross-sectional view of the conventional organic thin film transistor taken along line IV-IV of FIG. 3. The organic thin film transistor shown in FIGS. 3 and 4 is an inverted coplanar organic thin film transistor. FIG. 3 does not illustrate a gate electrode, which will be described later.

Referring to FIGS. 3 and 4, in the organic thin film transistor, a gate electrode 12 is formed on a substrate 10 and a gate insulating layer 16 is formed on the entire surface of the substrate 10 to cover the gate electrode 12. Source and drain electrodes 13 and 14 are formed on the gate insulating layer 16. An organic semiconductor layer 15 contacting the source and drain electrodes 13 and 14 is formed.

In the structure described above, as shown in FIG. 3, since the organic semiconductor layer 15 is formed in a circular shape, there are side portions of the source and drain electrodes 13 and 14 that do not contact the organic semiconductor layer 15. Namely, there are non-contact portions in the source and drain electrodes 13 and 14 to the organic semiconductor layer 15. Therefore, when forming an array of organic thin film transistors, the lengths of portions of the source and drain electrodes 13 and 14 contacting the organic semiconductor layer 15 are different between the plurality of organic thin film transistors. As a result, the physical characteristics of the organic thin film transistors, such as threshold voltage, are not uniform. Therefore, in a flat panel display apparatus having a plurality of organic thin film transistors, it is difficult to accurately and clearly reproduce input image signals because the characteristics of the organic thin film transistors are different among the plurality of organic thin film transistors electrically connected to various pixels.

SUMMARY OF CERTAIN INVENTIVE ASPECTS

The present invention provides an organic thin film transistor having an organic semiconductor layer that does not cause a coffee stain effect and that does not have imperfect contact with source and drain electrodes, as well as a flat panel display apparatus comprising the organic thin film transistor.

According to an aspect of the present invention, an organic thin film transistor comprises: a gate electrode; source and drain electrodes insulated from the gate electrode; and an organic semiconductor layer insulated from the gate electrode and contacting the source and drain electrodes, wherein the organic semiconductor layer has a circular shape when viewed through a substrate on which the organic thin film transistor is formed, and an edge portion of at least one of the source and drain electrodes contacting the organic semiconductor layer has a curved shape that is concave toward the organic semiconductor layer.

Edge portions of both the source and drain electrodes contacting the organic semiconductor layer may have curved shapes that are concave toward the organic semiconductor layer.

The gate electrode may have a circular shape when viewed through a substrate on which the organic thin film transistor is formed.

The length of an edge portion of the source electrode contacting the organic semiconductor layer and facing the drain electrode may be greater than the length of an edge portion of the drain electrode contacting the organic semiconductor layer and facing the source electrode.

The edge portions of the source and drain electrodes contacting the organic semiconductor layer wherein the length of an edge portion of the source electrode contacting the organic semiconductor layer and facing the drain electrode is greater than the length of an edge portion of the drain electrode contacting the organic semiconductor layer and facing the source electrode may have curved shapes that are concave toward the organic semiconductor layer.

The edge portion of the source electrode contacting the organic semiconductor layer may have a curved shape that is concave toward the organic semiconductor layer and the edge portion of the drain electrode contacting the organic semiconductor layer may have a straight shape.

The organic thin film transistor may further comprise a gate insulating layer insulating the source and drain electrodes and the organic semiconductor layer from the gate electrode.

The gate insulating layer may be formed on the gate electrode to cover the gate electrode, the source and drain electrodes may be formed on the gate insulating layer, and the organic semiconductor layer may be formed on the source and drain electrodes and the gate insulating layer.

The organic semiconductor layer may be formed on and between the source and drain electrodes, the gate insulating layer may be formed on the organic semiconductor layer to cover the organic semiconductor layer and the source and drain electrodes, and the gate electrode may be formed on the gate insulating layer.

According to another aspect of the present invention, a flat panel display apparatus comprising any of the above-described organic thin film transistors.

BRIEF DESCRIPTION OF THE DRAWINGS

These and other features and advantages of the present invention will become more apparent by describing in detail exemplary embodiments thereof with reference to the attached drawings in which.

DETAILED DESCRIPTION OF CERTAIN INVENTIVE EMBODIMENTS

Hereinafter, preferred embodiments of the present invention will be described in detail with reference to the accompanying drawings.

Figure 1:
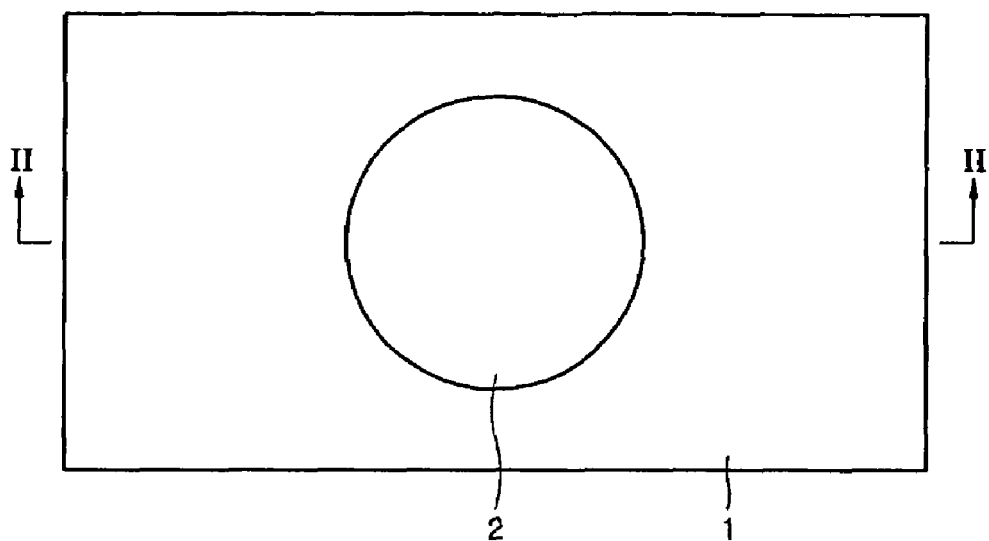
FIG. 1 is a schematic plan view of an organic semiconductor layer having a coffee stain effect.
Figure 2:
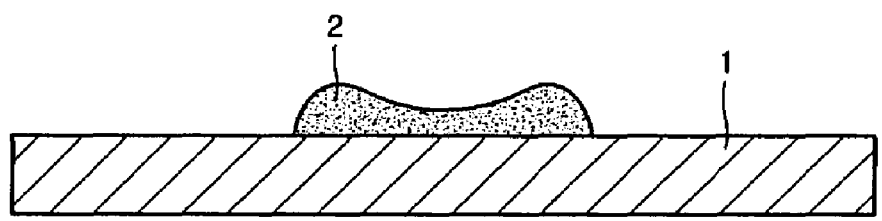
FIG. 2 is a cross-sectional view of the organic semiconductor layer shown in FIG. 1 taken along the line II-II.
Figure 3:
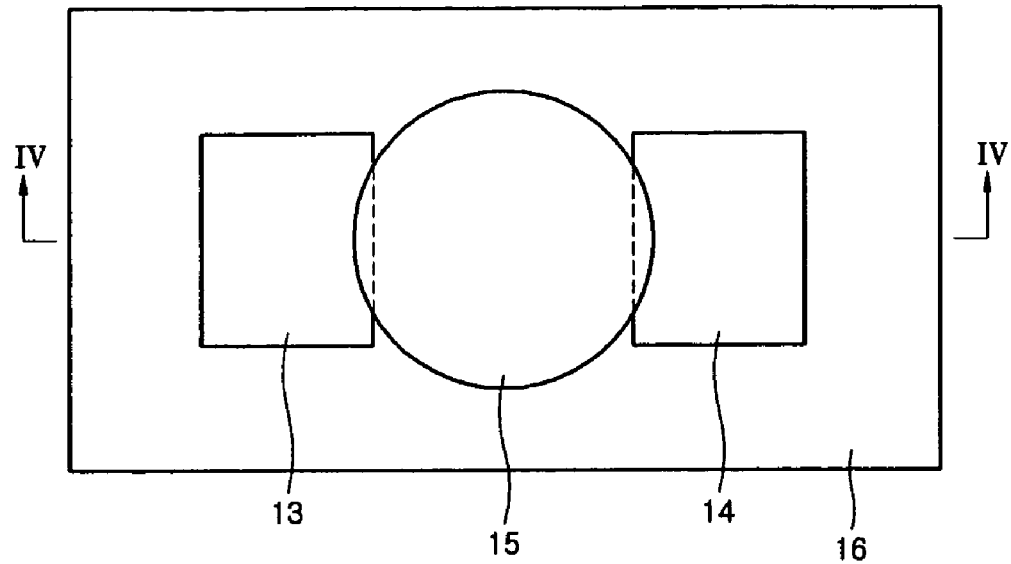
FIG. 3 is a schematic plan view of a conventional organic thin film transistor.
Figure 4:
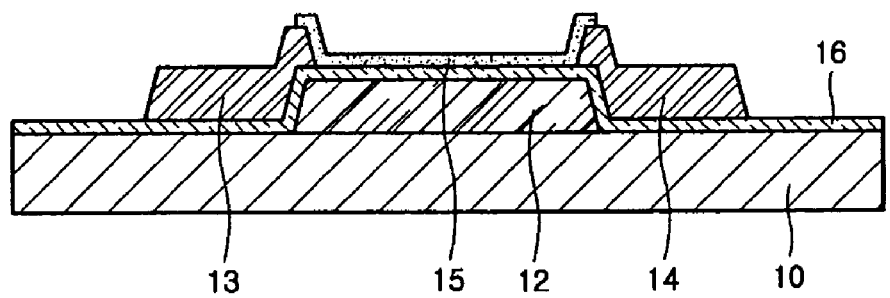
FIG. 4 is a cross-sectional view of a conventional organic thin film transistor taken along line IV-IV of FIG. 3.
Figure 5:
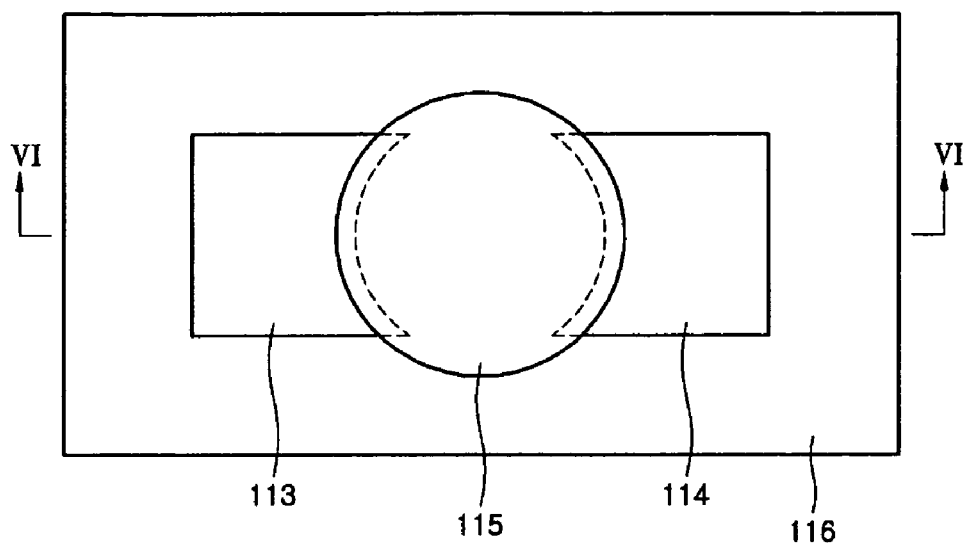
FIG. 5 is a schematic plan view of an organic thin film transistor according to a first embodiment of the present invention.
Figure 6:
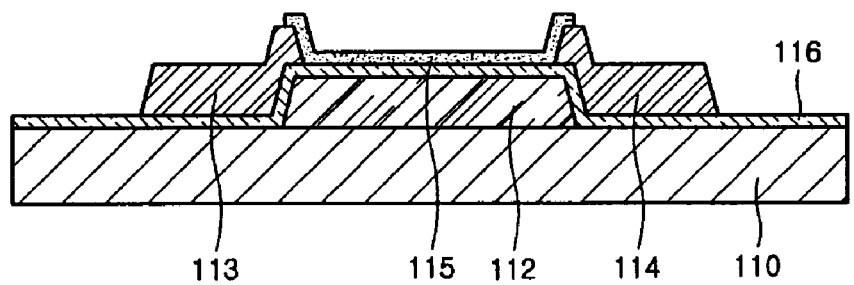
FIG. 6 is a cross-sectional view of an organic thin film transistor taken along line VI-VI of FIG. 5.

FIG. 5 is a schematic plan view of an organic thin film transistor according to one embodiment of the present invention. FIG. 6 is a cross-sectional view of an organic thin film transistor taken along line VI-VI of FIG. 5. FIG. 5 does not illustrate a gate electrode, which will be described later.

Referring to FIGS. 5 and 6, the organic thin film transistor comprises source and drain electrodes 113 and 114, which are isolated from a gate electrode 112, and an organic semiconductor layer 115, which is insulted from the gate electrode 112 but contacts the source and drain electrodes 113 and 114. The organic thin film transistor may further comprise a gate insulating layer 116, which insulates the source and drain electrodes 113 and 114 and the organic semiconductor layer 115 from the gate electrode 112.

In the structure described above, the organic semiconductor layer 115 has a circular shape when viewed through a substrate 110. Edge portions of the source and drain electrodes 113 and 114 contacting the organic semiconductor layer 115 have curved shapes that are concave toward the organic semiconductor layer 115. Although the edge portions of both the source and drain electrodes 113 and 114 contacting the organic semiconductor layer 115 in the organic thin film transistor shown in FIG. 5 are shaped to be concave toward the organic semiconductor layer 115, the edge portion of only the source electrode or the drain electrode may be shaped to be concave toward the organic semiconductor layer 115.

As described above, when the organic semiconductor layer is formed in a circular shape, and edge portions of the source and drain electrodes contacting the organic semiconductor layer are shaped to be straight, the edge portions inevitably include portions not contacting the organic semiconductor layer. Therefore, when a plurality of organic thin film transistors is formed, the lengths of portions of the source and drain electrodes contacting the organic semiconductor layer are different between the organic thin film transistors. As a result, the physical characteristics of the organic thin film transistors, such as the threshold voltages, are not uniform. Therefore, in a flat display apparatus comprising such organic thin film transistors, it is difficult to accurately and clearly reproduce input image signals due to the different characteristics of the organic thin film transistors electrically connected to various pixels.

In an organic thin film transistor according to the embodiment described above in which the organic semiconductor layer 115 has a circular shape, by forming the edge portions of the source and drain electrodes 113 and 114 contacting the organic semiconductor layer 115 to have curved shapes that are concave toward the organic semiconductor layer 115, organic thin film transistors can have uniform characteristics and the edge portions of the source and drain electrodes 113 and 114 can fully contact the organic semiconductor layer 115. Source and drain electrodes having such a shape may be formed by various methods, for example, deposition, using a fine metal mask (FMM), etc.

In the organic thin film transistor described above, the flow of current between the source and drain electrodes 113 and 114 may be controlled by an electric signal applied to the gate electrode 112. Accordingly, gate electrode 112 controls the formation of a channel region in an area of the organic semiconductor layer 115 between the source and drain electrodes 113 and 114. In this embodiment, since the edge portions of the source and drain electrodes 113 and 114 contacting the organic semiconductor layer 115 have curved shapes that are concave toward the organic semiconductor layer 115, edge portions of the gate electrode 112 may be the same curved shape as the edge portions of the source and drain electrodes 113 and 114. In particular, the larger the area of portions of the gate electrode 112 overlapping the source and drain electrodes 113 and 114, the greater the parasitic capacitance in the overlapped portions. However, this capacitance can be efficiently prevented when the gate electrode 112 is formed to have a circular shape. This is because the area of portions of the gate electrode 112 overlapping the source and drain electrodes 113 and 114 become minimized. Thus, the shape of the gate electrode 112 may be circular when viewed from a plane where the organic semiconductor layer 115 is located.

In the organic thin film transistor illustrated in FIGS. 5 and 6, the gate insulating layer 116 is formed to cover the gate electrode 112, the source and drain electrodes 113 and 114 are formed on the gate insulating layer 116, and the organic semiconductor layer 115 is formed on the source and drain electrodes 113 and 114 and the gate insulating layer 116. An organic thin film transistor having this structure is an inverted coplanar organic thin film transistor. However, the present invention is not limited to this type of organic thin film transistor.

For example, in a staggered-type organic thin film transistor in which an organic semiconductor layer is formed on source and drain electrodes and between the source and drain electrodes, a gate insulating layer may be formed on the organic semiconductor layer to cover the organic semiconductor layer and the source and drain electrodes and a gate electrode may be formed on the gate insulating layer. The organic semiconductor layer may be circular-shaped, and simultaneously, edge portions of the source and drain electrodes contacting the organic semiconductor layer may be formed to have curved shapes that are concave toward the organic semiconductor layer, thereby providing uniform characteristics to organic thin film transistors and allowing the edge portions of the source and drain electrodes to fully contact the organic semiconductor layer.

The present invention can be applied to an inverted staggered-type organic thin film transistor in which a gate insulating layer is formed covering a gate electrode, an organic thin film transistor is formed on the gate insulating layer, and source and drain electrodes are formed on edge portions of the organic thin film transistor and the gate insulating layer. The present invention may also be applied to other various types of organic thin film transistors.

Although inverted coplanar organic thin film transistors are exemplarily described in the following embodiments, the present invention is not limited to this type of organic thin film transistor.

Figure 7:
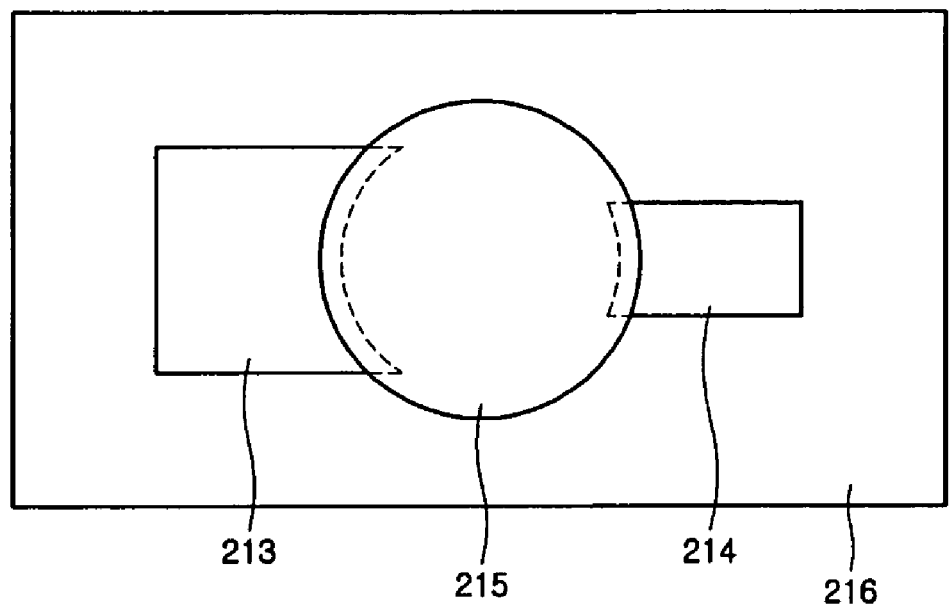
FIG. 7 is a schematic plan view of an organic thin film transistor according to another embodiment of the present invention.

FIG. 7 is a schematic plan view of an organic thin film transistor according to another embodiment of the present invention. FIG. 7 does not illustrate a gate electrode, which will be described later.

Referring to FIG. 7, the organic thin film transistor comprises source electrode 213 and drain electrode 214, which are insulated from a gate electrode (not shown), and an organic semiconductor layer 215, which is insulated from the gate electrode but contacts the source electrode 213 and the drain electrode 214. The organic thin film transistor comprises a gate insulating layer 216, which insulates the source electrode 213, the drain electrode 214, and the organic semiconductor layer 215 from the gate electrode.

In the structure described above, the organic semiconductor layer 215 has a circular shape when viewed through a substrate on which the thin film transistor is formed. Edge portions of the source electrode 213 and the drain electrode 214 contacting the organic semiconductor layer 215 are formed to have curved shapes that are concave toward the organic semiconductor layer 215.

The difference between the organic thin film transistor according to the current embodiment and the organic thin film transistor according to the previous embodiment in FIGS. 5 and 6 is that the length of the edge portion of the source electrode 213 contacting the organic semiconductor layer 215 and facing the drain electrode 214 is greater than the length of the edge portion of the drain electrode 214 contacting the organic semiconductor layer 215 and facing the source electrode 213.

In a flat panel display apparatus in which an organic thin film transistor is provided in each pixel, a drain electrode of the organic thin film transistor is electrically connected to the corresponding pixel, and a voltage is applied to the drain electrode. The energy barrier, which is the contact resistance between the drain electrode and the organic semiconductor layer, can be controlled by adjusting the voltage applied to the drain electrode.

However, the source electrode of the organic thin film transistor is grounded. Therefore, the energy barrier, which is the contact resistance between the source electrode and the organic semiconductor layer, is determined according to the work function of the metal composing the source electrode and the highest occupied molecular orbital (HOMO) level of the organic semiconductor layer. Once the organic thin film transistor is completely fabricated, it is difficult to control the contact resistance between the source electrode and the organic semiconductor layer. Therefore, it is important to make the contact resistance between the source electrode and the organic semiconductor layer smaller than the contact resistance between the drain electrode and the organic semiconductor layer during fabrication.

In general, the larger the length of an edge portion of an electrode contacting an organic semiconductor layer, the smaller the contact resistance between the organic semiconductor layer and the electrode. Therefore, by forming the length of the edge portion of the source electrode 213 contacting the organic semiconductor layer 215 and facing the drain electrode 214 to be larger than the length of the edge portion of the drain electrode 214 contacting the organic semiconductor layer 215 and facing the source electrode 213, the contact resistance between the source electrode 213 and the organic semiconductor layer 215 may be reduced to be smaller than the contact resistance between the drain electrode 214 and the organic semiconductor layer 215.

Figure 8:
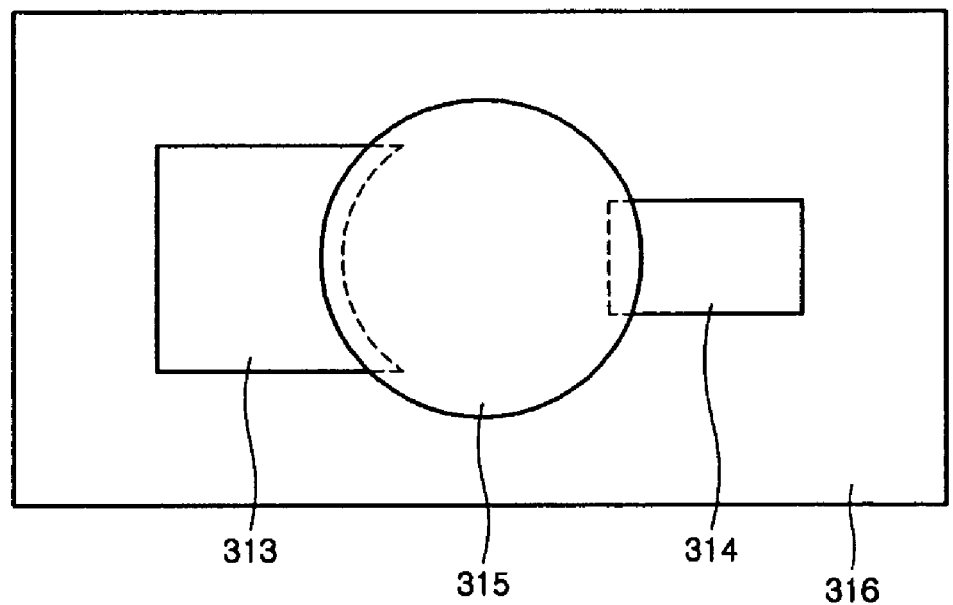
FIG. 8 is a schematic plan view of an organic thin film transistor according to still another embodiment of the present invention.

FIG. 8 is a schematic plan view of an organic thin film transistor according to still another embodiment of the present invention. FIG. 8 does not illustrate a gate electrode, which will be described later.

Referring to FIG. 8, the organic thin film transistor comprises source and drain electrodes 313 and 314, respectively, which are insulated from a gate electrode (not shown), and an organic semiconductor layer 315, which is insulated from the gate electrode but contacts the source electrode 313 and drain electrode 314. The organic thin film transistor comprises a gate insulating layer 316, which insulates the source electrode 313, the drain electrode 314, and the organic semiconductor layer 315 from the gate electrode.

In the structure described above, the organic semiconductor layer 315 has a circular shape when viewed through a substrate on which the thin film transistor is formed. An edge portion of the source electrode 313 contacting the organic semiconductor layer 315 has a curved shape that is concave toward the organic semiconductor layer 315. In addition, the length of the edge portion of the source electrode 313 contacting the organic semiconductor layer 315 and facing the drain electrode 314 is larger than the length of an edge portion of the drain electrode 314 contacting the organic semiconductor layer 315 and facing the source electrode 313. However, unlike the organic thin film transistor described above with reference to FIG. 7, the edge portion of the drain electrode 314 contacting the organic semiconductor layer 315 has a straight shape, not a curved shape that is concave toward the organic semiconductor layer 315.

The length of the edge portion of the source electrode 313 contacting the organic semiconductor layer 315 and facing the drain electrode 314 is greater than the length of the edge portion of the drain electrode 314 contacting the organic semiconductor layer 315 and facing the source electrode 313. Here, the width of the edge portion of the drain electrode 314 contacting the organic semiconductor layer 315 is less than the other edge portions of the drain electrode 314 such that the edge portion of the drain electrode 314 facing the source electrode 313 fully contacts the organic semiconductor layer 315. In addition, since the edge portion of the drain electrode 314 contacting the organic semiconductor layer 315 has a straight shape rather than a curved shape that is concave toward the organic semiconductor layer 315, it can be easily manufactured.

Figure 9:
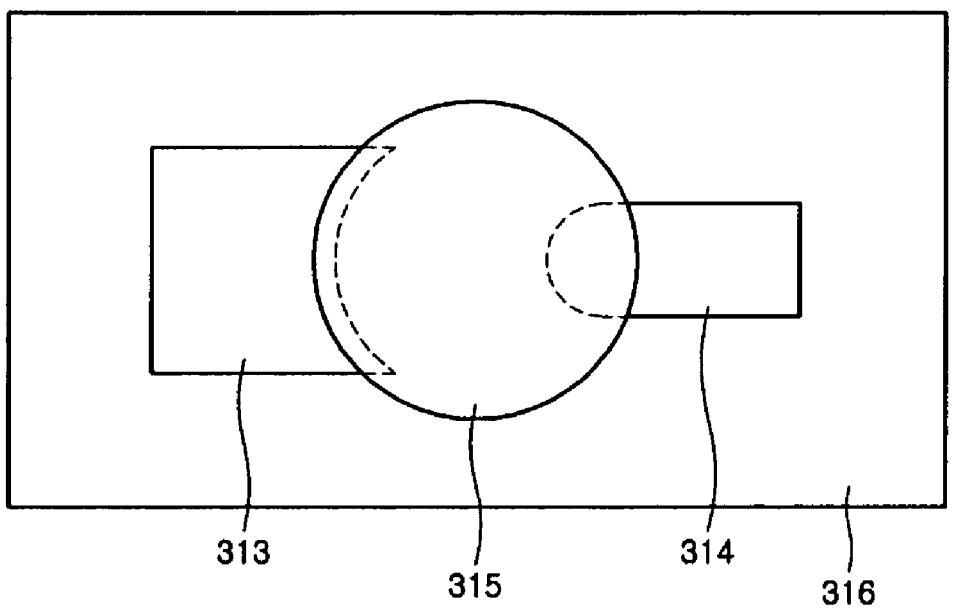
FIG. 9 is a schematic plan view of an organic thin film transistor according to a modification of the embodiment shown in FIG. 8.

FIG. 9 is a schematic plan view of an organic thin film transistor modified from the embodiment illustrated in FIG. 8. Referring to FIG. 9, the edge portion of the drain electrode 314 facing the source electrode 313 may have a shape corresponding to the shape of the edge portion of the source electrode 313 facing the drain electrode 314. In other words, the edge portion of the drain electrode 314 contacting the organic semiconductor layer 315 may have a curved shape that is convex toward the organic semiconductor layer 315.

According to the embodiments described above, a plurality of organic thin film transistors having the same characteristics, for example, the same threshold voltage, can be simultaneously formed on a single substrate. Such organic thin film transistors can be used in a flat panel display, for example. If the organic thin film transistors comprising the pixels that constitute a flat panel display, in which at least one organic thin film transistor is included in each pixel to control the operation of the pixel, have differing physical characteristics, an image corresponding to an input image signal cannot be accurately and clearly reproduced. However, when a plurality of organic thin film transistors having one of the structures described in the embodiments according to the present invention are used in a flat panel display, an accurate and distinct image can be reproduced by the flat display apparatus because their physical characteristics are uniform.

In particular, a flat display apparatus comprising such organic thin film transistors as described above may be an electroluminescent display device (ELD), a liquid crystal display (LCD), etc. A structure of an organic ELD, which is beneficial to implementing a flexible display apparatus, will be briefly described.

An ELD comprises pixel patterns of different colors, for example, red, green, and blue, which are determined according to the colors of light emitted in emission layers. Red, green, and blue sub-pixels each comprise an electroluminescent device, which is self-luminescent, and at least one thin film transistor connected to the electroluminescent device. These thin film transistors may be the organic thin film transistors described in the above embodiments. In addition, other elements such as a capacitor may be further included in the ELD.

The ELD, which is a current-driving light emitting device, emits red, green, or blue light according to the flow of current between two electrodes of the ELD, and forms images. The structure of the ELD will be briefly described. The ELD comprises a pixel electrode, which is connected to at least one of source and drain electrodes of each of the thin film transistors, a counter electrode covering all the pixels or counter electrodes respectively corresponding to the pixels, and an intermediate layer, which comprises at least an emission layer and is arranged between the pixel electrodes and the counter electrode. The present invention is not limited to this structure, and can be applied to various ELDs having different structures.

The pixel electrode may act as an anode while the counter electrode acts as a cathode, or the polarities of the pixel electrode and the counter electrodes may be reversed.

The pixel electrode may be formed as a transparent electrode or a reflective electrode. When the pixel electrode is formed as a transparent electrode, it may be made out of indium tin oxide (ITO), indium zinc oxide (IZO), ZnO, or $In_2O_3$. When the pixel electrode is formed as a reflective electrode, it may be made by forming a reflective layer using, for example, Ag, Mg, Al, Pt, Pd, Au, Ni, Nd, Ir, Cr, or a combination thereof, and depositing ITO, IZO, ZnO, or $In_2O_3$.

The counter electrode may also be formed as a transparent electrode or a reflective electrode. When the counter electrode is formed as a transparent electrode, it may be formed by depositing Li, Ca, LiF/Ca, LiF/Al, Al, Ag, Mg, or a combination thereof on a surface which faces the intermediate layer and forming an auxiliary electrode layer or a bus electrode line thereon using a material used for forming transparent electrodes, such as ITO, IZO, ZnO, or $In_2O_3$. When the counter electrode is formed as a reflective electrode, it may be formed by depositing Li, Ca, LiF/Ca, LiF/Al, Al, Ag, Mg, or a combination thereof on the entire surface. However, the pixel and counter electrodes are not limited to the above-described two types of electrodes, and may be formed of organic material, such as a conductive polymer, etc.

The intermediate layer may be formed out of an organic layer, such as a low-molecular weight organic layer or a high-molecular weight organic layer.

When a low-molecular weight organic layer is used, the intermediate layer may be formed as single or multiple stacks of a hole injection layer (HIL), a hole transport layer (HTL), an emission layer, an electron transport layer (ETL), an electron injection layer (EIL), etc. Organic materials that can be used for this structure include various materials, for example, copper phthalocyanine (CuPc), N,N'-Di(naphthalene-1-yl)-N,N'-diphenyl-benzidine (NPB), tris-8-hydroxyquinoline aluminum (Alq3), etc. The low-molecular weight organic layer may be formed by depositing such an organic material in a vacuum while heating. The structure of the intermediate layer is not limited to this, and may comprise various layers.

When a high-molecular weight organic layer is used, the intermediate layer may comprise a hole transport layer (HTL) and an emitting layer (EML). The HTL may be formed using poly-(2,4)-ethylene-dihydroxy thiophene (PEDOT), polyaniline (PANI), etc., by an inkjet printing or spin coating method. The EML may be formed as a color pattern using poly(p-phenylene vinylene) (PPV), soluble PPV's, Cyano-PPV, polyfluorene, or the like by a general method, such as an inkjet printing method, a spin coating method, or a laser thermal transfer method. The structure of the intermediate layer formed using such high-molecular weight organic layers is not limited to the above structure, and may comprise various layers.

In the ELD having the above-described structure, an organic semiconductor layer has a circular shape when viewed from a plane where a gate electrode is formed. At least one organic thin film transistor in which the edge portion of at least one of the source and drain electrodes contacting the organic semiconductor layer has a curved shape that is concave toward the organic thin film transistor is connected to the pixel electrodes, thereby controlling the flow of current entering the pixel electrodes to control the light emission from the pixels. When organic thin film transistors having the structure described above are used in the ELD, images can be accurately and clearly reproduced according to an image signal input to the organic ELD.

Organic thin film transistors according to the embodiments described above can be used in various flat display apparatuses, in addition to the ELD or LCD described above, and in any apparatus comprising organic thin film transistors, such as electronic sheet, a smart card, a smart tag, a plastic chip for radio frequency identification (RFID), etc.

As described above, an organic thin film transistor according to the present invention and a flat display apparatus using the organic thin film transistor provide at least the following effects:

First, since the organic semiconductor layer has a circular shape when viewed from the plane where the gate electrode is located, and the edge portion of at least one of the source and drain electrodes contacting the organic semiconductor layer has a curved shape that is concave toward the organic semiconductor layer, organic thin film transistors having this structure have uniform characteristics, and edge portions of the source and drain electrodes can fully contact the organic semiconductor layer.

Second, since the organic semiconductor layer has a circular shape when viewed from the plane where the gate electrode is located, and the edge portion of at least one of the source and drain electrodes contacting the organic semiconductor layer has a curved shape that is concave toward the organic semiconductor layer, the density of charges migrating through a channel between the source and drain electrodes is uniform.

Third, when a plurality of organic thin film transistors having uniform characteristics due to the structure described above are used in a flat display apparatus, the flat display apparatus can accurately and consistently reproduce images according to an image signal input.

While the present invention has been particularly shown and described with reference to exemplary embodiments thereof, it will be understood by those skilled in the art that various and equivalent changes in form and details may be made therein without departing from the spirit and scope of the present invention as defined by the appended claims.

What is claimed is:

1. An organic thin film transistor comprising:
   a gate electrode;
   source and drain electrodes insulated from the gate electrode; and
   an organic semiconductor layer insulated from the gate electrode and contacting the source and drain electrodes, wherein the organic semiconductor layer has a circular shape when viewed through a substrate on which the organic thin film transistor is formed, and edge portions of both the source and drain electrodes contacting the organic semiconductor layer have curved shapes that are concave toward the organic semiconductor layer.

2. The organic thin film transistor of claim 1, wherein the gate electrode has a circular shape when viewed through a substrate on which the organic thin film transistor is formed.

3. The organic thin film transistor of claim 1, wherein the length of an edge portion of the source electrode contacting the organic semiconductor layer and facing the drain electrode is greater than the length of an edge portion of the drain electrode contacting the organic semiconductor layer and facing the source electrode.

4. The organic thin film transistor of claim 1 further comprising a gate insulating layer insulating the source and drain electrodes and the organic semiconductor layer from the gate electrode.

5. The organic thin film transistor of claim 4, wherein the gate insulating layer is formed on the gate electrode to cover the gate electrode, the source and drain electrodes are formed on the gate insulating layer, and the organic semiconductor layer is formed on the source and drain electrodes and the gate insulating layer.

6. The organic thin film transistor of claim 4, wherein the organic semiconductor layer is formed on and between the source and drain electrodes, the gate insulating layer is formed on the organic semiconductor layer to cover the organic semiconductor layer and the source and drain electrodes, and the gate electrode is formed on the gate insulating layer.

7. A flat panel display comprising at least one organic thin film transistor comprising:
   a gate electrode;
   source and drain electrodes insulated from the gate electrode;
   an organic semiconductor layer insulated from the gate electrode and contacting the source and drain electrodes, wherein the organic semiconductor layer has a circular shape when viewed through a substrate on which the organic thin film transistor is formed, and an edge portion of at least one of the source and drain electrodes contacting the organic semiconductor layer has a curved shape that is concave toward the organic semiconductor layer; and a channel region between the source and drain electrodes, wherein distance between the source and drain electrodes varies across the channel region.

8. A flat panel display comprising at least one organic thin film transistor comprising:

a gate electrode;

source and drain electrodes insulated from the gate electrode; and an organic semiconductor layer insulated from the gate electrode and contacting the source and drain electrodes, wherein the organic semiconductor layer has a circular shape when viewed through a substrate on which the organic thin film transistor is formed, and an edge portion of at least one of the source and drain electrodes contacting the organic semiconductor layer has a curved shape that is concave toward the organic semiconductor layer, wherein edge portions of both the source and drain electrodes contacting the organic semiconductor layer have curved shapes that are concave toward the organic semiconductor layer.

9. An organic thin film transistor comprising:

a gate electrode;

source and drain electrodes insulated from the gate electrode;

an organic semiconductor layer insulated from the gate electrode and contacting the source and drain electrodes, wherein the organic semiconductor layer has a circular shape when viewed through a substrate on which the organic thin film transistor is formed, and an edge portion of at least one of the source and drain electrodes contacting the organic semiconductor layer has a curved shape that is concave toward the organic semiconductor layer; and a channel region between the source and drain electrodes, wherein distance between the source and drain electrodes varies across the channel region.

10. The organic thin film transistor of claim 9, wherein the gate electrode has a circular shape when viewed through a substrate on which the organic thin film transistor is formed.

11. The organic thin film transistor of claim 9, wherein the length of an edge portion of the source electrode contacting the organic semiconductor layer and facing the drain electrode is greater than the length of an edge portion of the drain electrode contacting the organic semiconductor layer and facing the source electrode.

12. The organic thin film transistor of claim 9 further comprising a gate insulating layer insulating the source and drain electrodes and the organic semiconductor layer from the gate electrode.

13. The organic thin film transistor of claim 12, wherein the gate insulating layer is formed on the gate electrode to cover the gate electrode, the source and drain electrodes are formed on the gate insulating layer, and the organic semiconductor layer is formed on the source and drain electrodes and the gate insulating layer.

14. The organic thin film transistor of claim 12, wherein the organic semiconductor layer is formed on and between the source and drain electrodes, the gate insulating layer is formed on the organic semiconductor layer to cover the organic semiconductor layer and the source and drain electrodes, and the gate electrode is formed on the gate insulating layer.

* * * * *